(12) United States Patent
Huang et al.

(10) Patent No.: US 11,032,916 B2
(45) Date of Patent: Jun. 8, 2021

(54) METHOD FOR MANUFACTURING CIRCUIT BOARD

(71) Applicant: HON HAI PRECISION INDUSTRY CO., LTD., New Taipei (TW)

(72) Inventors: Ren-Yi Huang, New Taipei (TW); I-Hsun Tseng, New Taipei (TW); Yuan-Hung Chien, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 157 days.

(21) Appl. No.: 16/369,055

(22) Filed: Mar. 29, 2019

(65) Prior Publication Data

US 2020/0236794 A1   Jul. 23, 2020

(30) Foreign Application Priority Data

Jan. 23, 2019   (CN) .......................... 201910065300.0

(51) Int. Cl.
| | | |
|---|---|---|
| *H05K 3/02* | (2006.01) | |
| *H05K 3/10* | (2006.01) | |
| *H05K 3/46* | (2006.01) | |
| *H05K 3/24* | (2006.01) | |
| *H05K 3/40* | (2006.01) | |
| *H05K 3/12* | (2006.01) | |

(52) U.S. Cl.
CPC ................ *H05K 3/46* (2013.01); *H05K 3/02* (2013.01); *H05K 3/12* (2013.01); *H05K 3/246* (2013.01); *H05K 3/40* (2013.01); *H05K 3/4685* (2013.01); *H05K 3/1216* (2013.01)

(58) Field of Classification Search
CPC ........ H05K 3/46; H05K 3/4685; H05K 3/246; H05K 3/40; H05K 3/1216; H05K 3/12; H05K 3/02; H05K 2201/10053; H05K 3/282; Y10T 29/49155
USPC .................................................... 29/832, 846
See application file for complete search history.

(56) References Cited

U.S. PATENT DOCUMENTS 8,305,359 B2 * 11/2012 Bolender ............. H01H 13/702
                                                                 345/174
8,610,689 B2 * 12/2013 Chang ................... G06F 1/1692
                                                                 345/173

* cited by examiner

*Primary Examiner* — Donghai D Nguyen
(74) *Attorney, Agent, or Firm* — ScienBiziP, P.C.

(57) ABSTRACT

A method for manufacturing circuit board, including: providing a substrate; printing a first conductive layer on a surface of the substrate, the first conductive layer includes a plurality of electrode units arranged in an M*N array, each of the electrode units includes a first electrode, and a plurality of second electrodes distributed around the first electrode; printing a first insulating layer on a side of the first conductive layer away from the substrate; printing a second conductive layer on a side of the first insulating layer away from the substrate; printing an anti-oxidation layer to cover surfaces of the first conductive layer and the second conductive layer away from the substrate; and printing a second insulating layer to cover regions of the substrate not covered by the first electrode and the second electrode. A circuit board is also provided.

10 Claims, 7 Drawing Sheets

METHOD FOR MANUFACTURING CIRCUIT BOARD

FIELD

The disclosure generally relates to circuit boards.

BACKGROUNDING

Electronic devices such as keyboards and touch panels are generally connected to microprocessors using printed circuit boards (PCBs) with a plurality of first electrodes and second electrodes to transmit a user's pressing signal. However, conventional PCBs are individually made and are expensive.

Therefore, there is room for improvement within the art.

BRIEF DESCRIPTION OF THE DRAWINGS

Many aspects of the present disclosure can be better understood with reference to the drawings. The components in the drawings are not necessarily drawn to scale, the emphasis instead being placed upon clearly illustrating the principles of the disclosure. Moreover, in the drawings, like reference numerals designate corresponding parts throughout the views.

DETAILED DESCRIPTION

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts have been exaggerated to better illustrate details and features of the present disclosure. The description is not to be considered as limiting the scope of the embodiments described herein.

Several definitions that apply throughout this disclosure will now be presented. The term "comprising" means "including, but not necessarily limited to"; it specifically indicates open-ended inclusion or membership in a so-described combination, group, series, and the like. The term "coupled" is defined as connected, whether directly or indirectly through intervening components, and is not necessarily limited to physical connecting. The connecting can be such that the objects are permanently connected or releasably connected.

Figure 1:
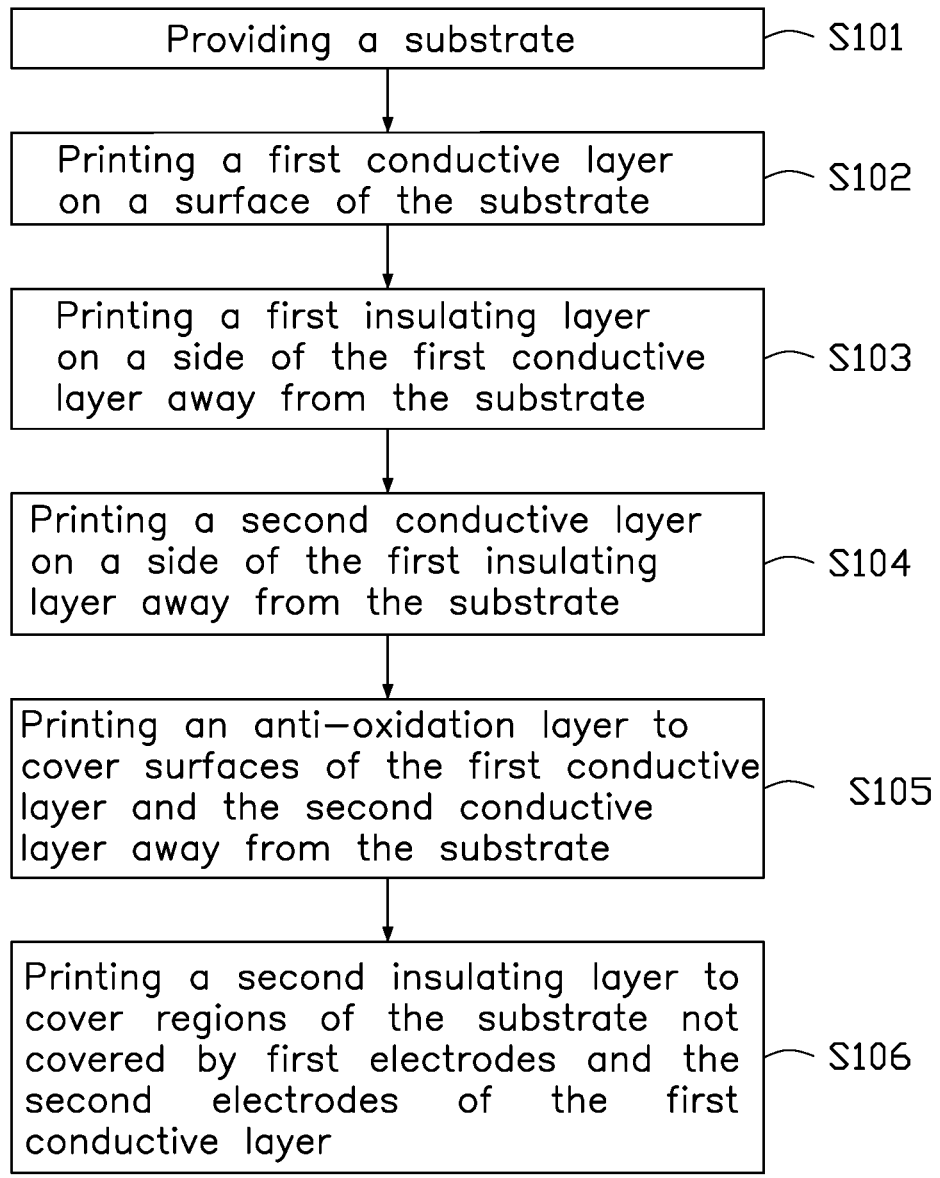
FIG. 1 is a flow chart of a method for manufacturing a circuit board according to an embodiment of the present disclosure.
Figure 2:
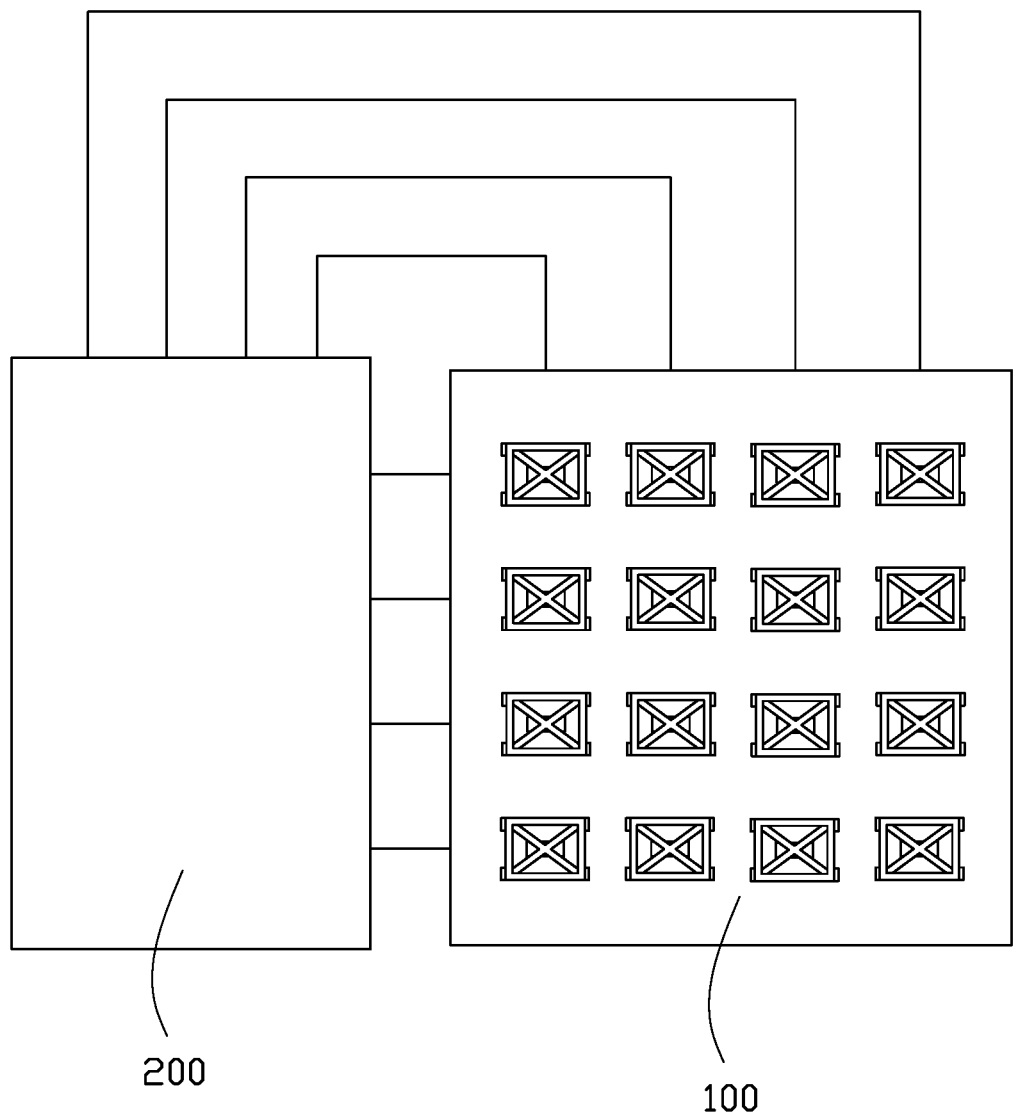
FIG. 2 is a schematic diagram of a circuit board in use according to an embodiment of the present disclosure.
Figure 3:
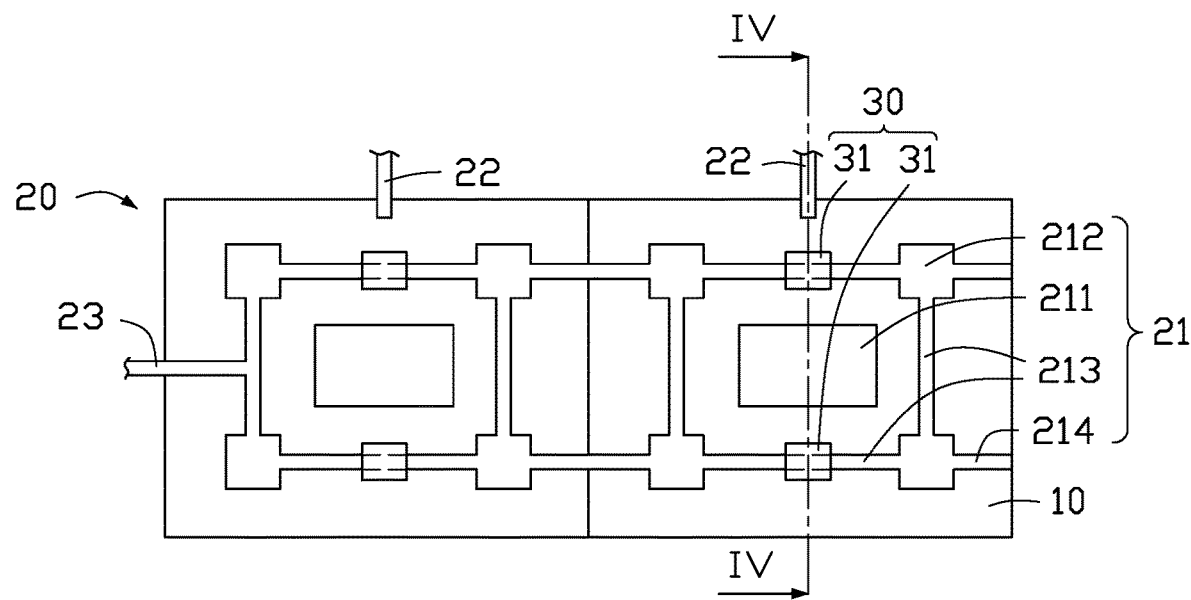
FIG. 3 is a top view of a part of the circuit board shown in FIG. 2.
Figure 4:
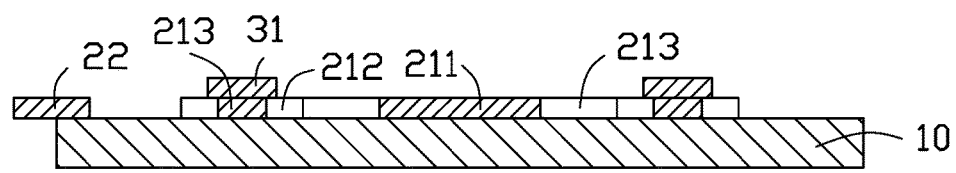
FIG. 4 is a cross-sectional view along line IV-IV of FIG. 3.
Figure 5:
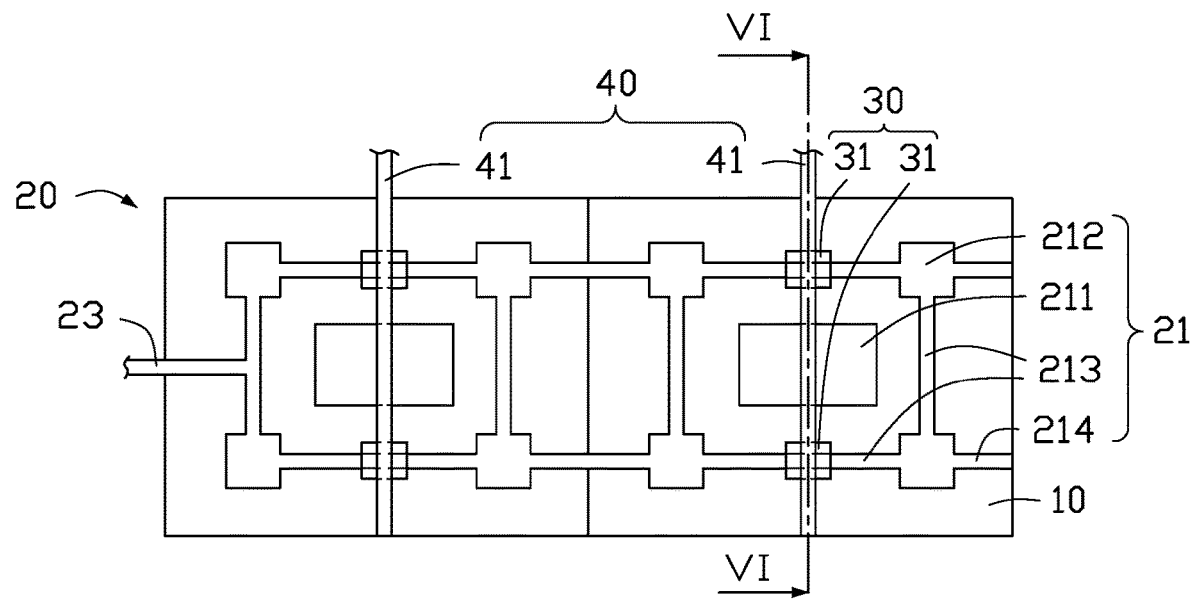
FIG. 5 is a top view of a part of the circuit board shown in FIG. 2.
Figure 6:
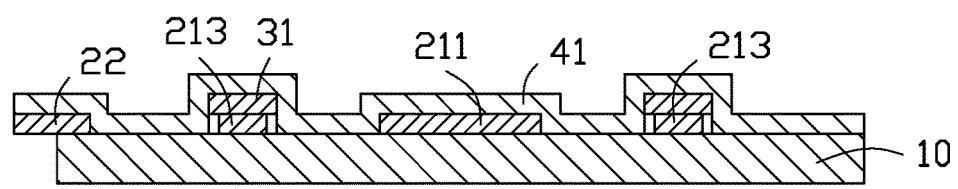
FIG. 6 is a cross-sectional view along line VI-VI of FIG. 5.
Figure 7:
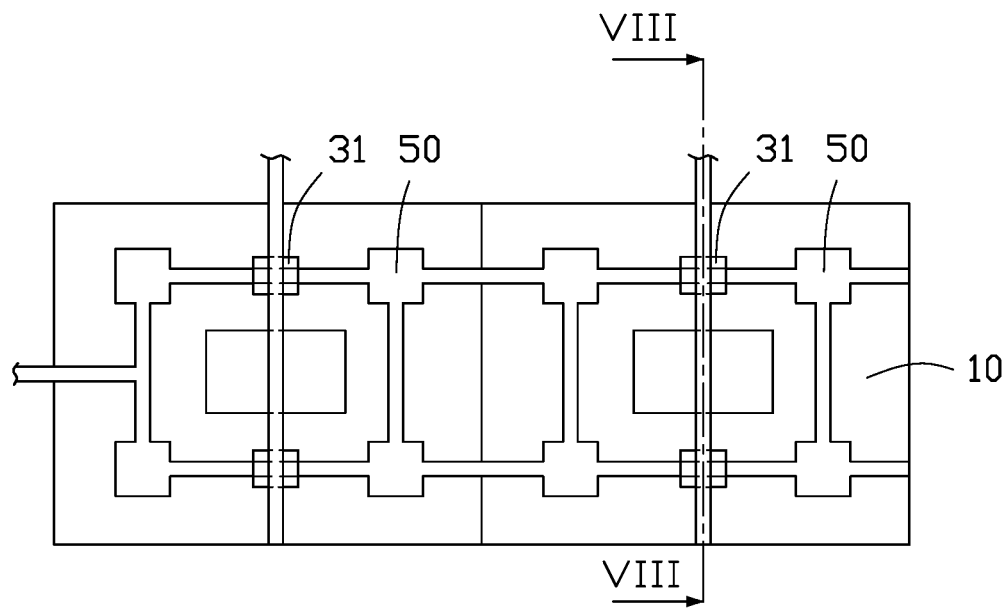
FIG. 7 is a top view of a part of the circuit board shown in FIG. 2.
Figure 8:
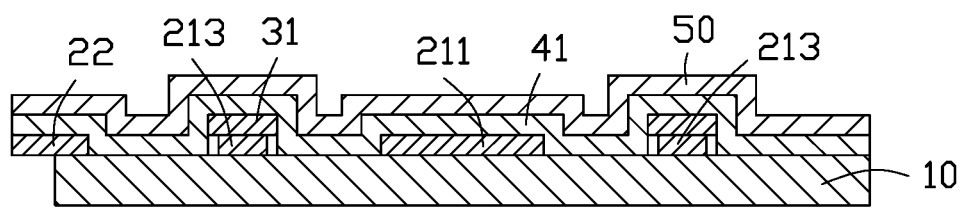
FIG. 8 is a cross-sectional view along line VIII-VIII of FIG. 7.
Figure 9:
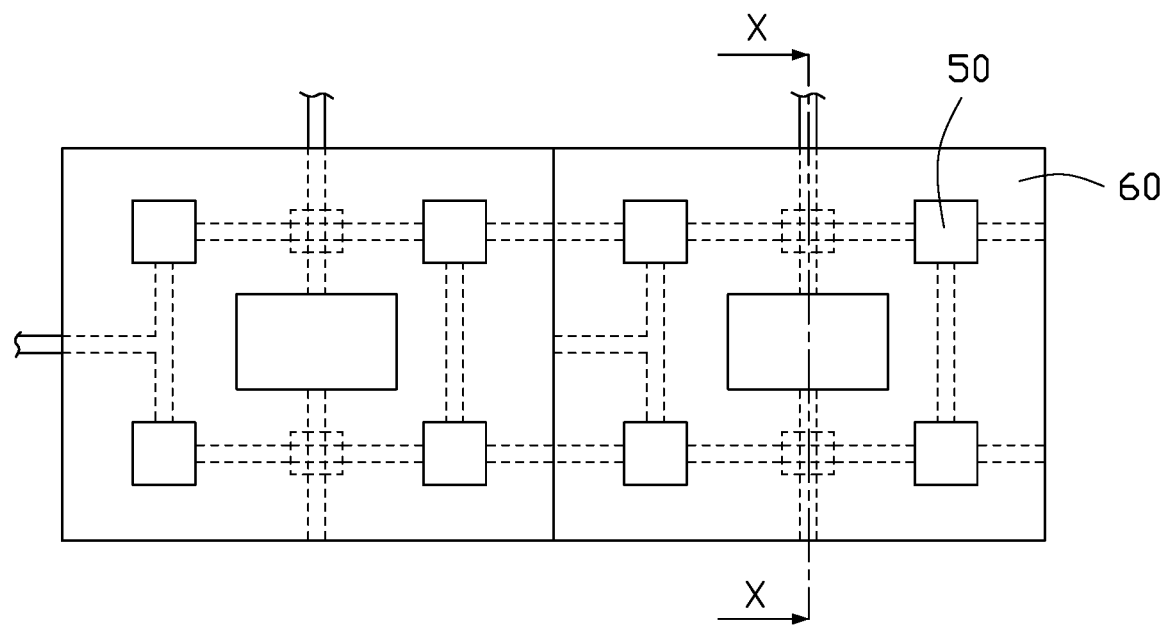
FIG. 9 is a top view of a part of the circuit board shown in FIG. 2.
Figure 10:
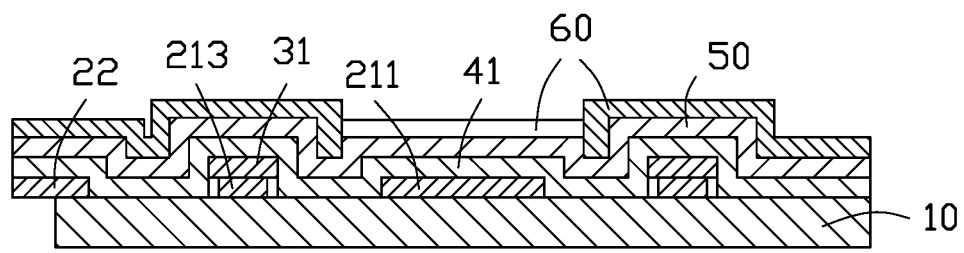
FIG. 10 is a cross-sectional view along line X-X of FIG. 9.
Figure 11:
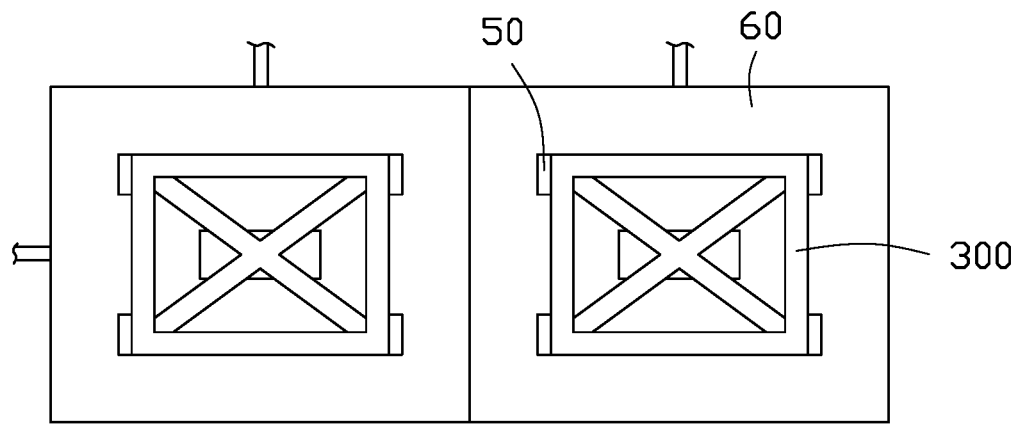
FIG. 11 is a top view of a part of the circuit board shown in FIG. 2.

A method for manufacturing a circuit board is illustrated in FIG. 1. The method is provided by way of embodiments, as there are a variety of ways to carry out the method. Each block shown in FIG. 1 represents one or more processes, methods, or subroutines carried out in the example method. The method can begin at block S101.

At block S101, a substrate is provided.

Material of the substrate may be glass, polypropylene (PP), polyethylene terephthalate (PET), polyvinyl chloride (PVC), polymethyl methacrylate (PMMA) or the like. In the present embodiment, the substrate is made of PMMA material.

At block S102, a first conductive layer is printed on a surface of the substrate.

Specifically, the first conductive layer includes a plurality of electrode units arranged in an M by N array, N being first leads, and M being second leads, wherein M and N are positive integers greater than or equal to 2. The electrode units are arranged in an array, that is, the electrode units are arranged in M rows and N columns. Each of the first leads is located at one end of a corresponding column of the electrode units. Each of the second leads is located at one end of a corresponding row of the electrode units.

Each of the electrode units includes a first electrode, four second electrodes, four third leads, and at least one fourth lead. The four second electrodes are distributed around the first electrode. The four third leads are configured for connecting the four second electrodes end to end. The fourth lead is configured for connecting two adjacent second electrodes of two adjacent electrode units of the same row. The second lead is connected to the closest one of the third leads.

In the present embodiment, the first conductive layer is obtained by screen printing with silver paste.

At block S103, a first insulating layer is printed on a side of the first conductive layer away from the substrate.

The first insulating layer includes a plurality of insulating blocks covering the third leads, obtained by screen printing with a dielectric material.

At block S104, a second conductive layer is printed on a side of the first insulating layer away from the substrate.

The second conductive layer includes N fifth leads. Each of the fifth leads is connected to the first electrode of a corresponding column of the electrode units, and is connected to a corresponding first lead. The fifth lead and the third lead are separated by a corresponding insulating block to avoid electrical contact.

In the present embodiment, the second conductive layer is obtained by screen printing with silver paste.

At block S105, an anti-oxidation layer is printed to cover surfaces of the first conductive layer and the second conductive layer away from the substrate.

The anti-oxidation layer is obtained by screen printing with copper paste, and prevents oxidation of the first conductive layer and the second conductive layer.

At block S106, a second insulating layer is printed to cover regions of the substrate not covered by the first electrode and the second electrode, and a circuit board is obtained.

The second insulating layer is obtained by screen printing with a dielectric material to prevent moisture and scratches.

FIG. 2 to FIG. 11 show a circuit board 100 made by the above method illustrated in FIG. 1. The circuit board 100 includes a substrate 10, a first conductive layer 20, a first insulating layer 30, a second conductive layer 40, an anti-oxidation layer 50, and a second insulating layer 60.

The first conductive layer 20 is located on a side of the substrate 10. The first conductive layer 20 includes a plurality of electrode units 21 arranged in an M*N array, N first leads 22, and M second leads 23, wherein M and N are positive integers greater than or equal to 2. The electrode units 21 are arranged in an array, that is, the electrode units 21 are arranged in M rows and N columns. Each of the first leads 22 is located at one end of a corresponding column of the electrode units 21. Each of the second leads 23 is located at one end of a corresponding row of the electrode units 21.

Each of the electrode units 21 includes a first electrode 211, four second electrodes 212, four third leads 213, and at least one fourth lead 214. The four second electrodes 212 are distributed around the first electrode 211. The four third leads 213 are configured for connecting the four second electrodes 212 end to end. The fourth lead 214 is configured for connecting two adjacent second electrodes 212 of two adjacent electrode units 21 of the same row. The second lead 23 is connected to the closest one of the third leads 213.

The first insulating layer 30 includes plurality of insulating blocks 31 covering the third leads 213.

The second conductive layer 40 includes N fifth leads 41. Each of the fifth leads 41 is connected to one first electrode 211 of a corresponding column of the electrode units 21, and is connected to a corresponding first lead 22. The fifth lead 41 and the third lead 213 are separated by a corresponding insulating block 31 to avoid electrical contact.

In the present embodiment, the first conductive layer 20 and the second conductive layer 40 are obtained by screen printing with silver paste.

The anti-oxidation layer 50 covers the first conductive layer 20 and the second conductive layer 40 away from the substrate 10. In the present embodiment, the anti-oxidation layer 50 is obtained by screen printing with copper paste, and is configured for preventing oxidation of the first conductive layer 20 and the second conductive layer 40.

The second insulating layer 60 covers regions of the substrate 10 not covered by the first electrode 211 and the second electrode 212, so as to prevent moisture and scratches.

The circuit board 100 is applied to an electronic device (not shown). The electronic device can be a keyboard or a touch panel or the like. Each of the first leads 22 and each of the second leads 23 are extended and connected to a microprocessor 200. Each of the electrode units 21 can be mated with a metal dome 300. The edge of each of the metal domes 300 is connected to four corresponding second electrodes 212, and the middle portion of each of the metal domes 300 is arched. When subjected to pressure, the middle portion of the metal dome 300 makes contact with the first electrode 211, so that a signal is triggered by pressure and is transmitted to the microprocessor 200.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being exemplary embodiments of the present disclosure.

What is claimed is:

1. A method for manufacturing a circuit board, comprising:
   providing a substrate;
   printing a first conductive layer on a surface of the substrate, wherein
      the first conductive layer comprises a plurality of electrode units arranged in an M by N array, N being a number of first lead, and M being a number of second leads, each of the first leads is located at one end of a corresponding column of the electrode units, each of the second leads is located at one end of a corresponding row of the electrode units,
      each of the electrode units comprises a first electrode, a plurality of second electrodes distributed around the first electrode, a plurality of third leads configured for connecting the second electrodes end to end, and a plurality of forth leads configured for connecting the adjacent electrode unit;
   printing a first insulating layer on a side of the first conductive layer away from the substrate, the first insulating layer comprises a plurality of insulating blocks covering the third leads;
   printing a second conductive layer on a side of the first insulating layer away from the substrate, wherein the second conductive layer comprises N fifth leads, each of the fifth leads is connected to the first electrode of a corresponding column of the electrode units, and is connected to a corresponding first lead;
   printing an anti-oxidation layer to cover surfaces of the first conductive layer and the second conductive layer away from the substrate; and
   printing a second insulating layer to cover regions of the substrate not covered by the first electrode and the second electrode.

2. The method for manufacturing circuit board as claimed in claim 1, wherein the substrate is made of glass, polypropylene, polyethylene terephthalate, polyvinyl chloride, or polymethyl methacrylate.

3. The method for manufacturing circuit board as claimed in claim 1, wherein M and N are positive integers greater than or equal to 2.

4. The method for manufacturing circuit board as claimed in claim 1, wherein each of the electrode units comprises four second electrodes and four third leads, each of the third leads is configured for connecting two adjacent second electrodes, and each of the second leads is connected to a closest one of the third leads.

5. The method for manufacturing circuit board as claimed in claim 1, wherein each of the fourth lead is configured for connecting two adjacent second electrodes of two adjacent electrode units of the same row.

6. The method for manufacturing circuit board as claimed in claim 1, wherein the fifth lead and the third lead are separated by a corresponding insulating block to avoid electrical contact.

7. The method for manufacturing circuit board as claimed in claim 1, wherein the first conductive layer is obtained by screen printing with silver paste.

8. The method for manufacturing circuit board as claimed in claim 1, wherein the second conductive layer is obtained by screen printing with silver paste.

9. The method for manufacturing circuit board as claimed in claim 1, wherein the anti-oxidation layer is obtained by screen printing with copper paste.

10. The method for manufacturing circuit board as claimed in claim 1, wherein the first insulating layer and the second insulating layer are obtained by screen printing with dielectric materials.

* * * * *